United States Patent [19]
Curtis et al.

[11] 3,974,486
[45] Aug. 10, 1976

[54] MULTIPLICATION MODE BISTABLE FIELD EFFECT TRANSISTOR AND MEMORY UTILIZING SAME

[75] Inventors: Huntington W. Curtis, Chelsea; Roger L. Verkuil, Poughkeepsie, both of N.Y.

[73] Assignee: International Business Machines Corporation, Armonk, N.Y.

[22] Filed: Apr. 7, 1975

[21] Appl. No.: 565,326

[52] U.S. Cl. ............................ 340/173 R; 307/283; 340/173 NR
[51] Int. Cl.² ...................................... G11C 11/40
[58] Field of Search ................ 340/173 R, 173 NR; 307/283

[56] References Cited
UNITED STATES PATENTS

| | | | |
|---|---|---|---|
| 3,528,035 | 9/1970 | Venohara | 340/173 NR |
| 3,538,400 | 11/1970 | Yanai | 340/173 NR |

*Primary Examiner*—Terrell W. Fears
*Attorney, Agent, or Firm*—Wesley DeBruin

[57] ABSTRACT

A novel solid state device which exhibits two-terminal negative resistance characteristics. The negative resistance characteristic may be readily shaped by external bias control, providing a wide range of oscillatory or bistable properties. The negative resistance characteristic is obtained by a novel means of device operation exploiting an electron hole pair multiplication effect which is enhanced by high substrate doping in conjunction with appropriate biasing of the junctions within the device.

The device exhibits a bias voltage controlled small signal negative resistance region, i.e., the device has a unique feature, a negative slope over an adjustable portion of its V-I characteristic. Bistable action is obtained with a single device. In the first stable state ("off") of the device, power dissipation is zero. In the second stable state ("on") of the device, power dissipation is adjustable to less than one micro-watt.

One embodiment of the device is a novel and unobvious modification of a known N channel FET structure. The device may be readily fabricated by using large scale integration techniques well known in present day FET technology.

The novel solid state device has utility in at least the following applications: (1.) high density non-refresh memory; (2) gated latch (as three terminal device); (3) astable, monostable and bistable devices; (4) level detector, and (5) small signal (linear) oscillatory circuit.

19 Claims, 9 Drawing Figures

MULTIPLICATION MODE BISTABLE FIELD EFFECT TRANSISTOR AND MEMORY UTILIZING SAME

The above ABSTRACT is not to be taken either as a complete exposition or as a limitation of the present invention, the full nature and extent of the invention being discernible only by reference to and from the entire disclosure.

BACKGROUND OF THE INVENTION AND PRIOR ART

Metal Oxide Semiconductor Field Effect Transistors (MOSFETS) or Insulated Gate Field Effect Transistors (IGFETs) are well known in the art. Reference is made to the article "Metal-Oxide-Semiconductor Technology" by William C. Hittinger, published in the August 1973 issue of Scientific American, pages 48 through 57. There are numerous patents, published articles and texts which disclose the theory, methods of fabricating, and circuit devices utilizing MOSFETS or IGFETS. One such text is "MOSFET in Circuit Design" by Robert H. Crawford (Texas Instruments Electronic Series) McGraw Hill, copyrighted 1967 by Texas Instruments Incorporated. Another text is "Electronics: BJTs, FETs, and Microcircuits" by E. James Angelo, Jr., McGraw-Hill Electrical and Electronic Engineering Series, copyrighted by McGraw-Hill 1969.

The MOSFET or IGFET transistor generally comprises a first semiconductor region in which source and drain regions of opposite conductivity type to the region are disposed. A channel region is defined between the source and drain regions. The channel conductivity is variable in accordance with potentials applied to a gate electrode capacitively coupled thereto through an insulating layer disposed on the channel surface. MOS-type transistors are of increasing interest, particularly because of their high input impedance compared with bipolar transistors and also because a large number of such elements may be disposed in a single body of material economically where the intended circuit application requires MOS transistors.

U.S. Pat. No. 3,440,503 granted Apr. 22, 1969 to R. C. Gallagher et al is directed to integrated complementary MOS transistor structures and a method of making the same.

U.S. Pat. No. 3,447,046 granted May 27, 1969 to J. R. Cricchi et al is directed to integrated complementary MOS transistor structures and a method of making same. U.S. Pat. No. 3,447,046 is closely related in subject matter to U.S. Pat. No. 3,440,503. In U.S. Pat. No. 3,447,046, complementary MOS transistors are disclosed utilizing out-diffusion through an epitaxially grown layer to form a region in which one of te transistor elements is disposed, the epitaxially grown layer being opposite in conductivity type to that of the original substrate with an isolation wall, which may also be out-diffused, extending through the epitaxial layer to the substrate. Preferably the out-diffused regions are formed with a slow diffusing impurity such as arsenic.

U.S. Pat. No. 3,450,961 granted June 17, 1969 to J. C. Tsai is directed to semiconductor devices with a region having portions of differing depth and concentration. In U.S. Pat. No. 3,450,961 semiconductor devices, such as MOS transistors, are disclosed with a P type region having portions of different depth and impurity concentration particularly suitable for the base region of bipolar transistors and the channel region of MOS transistors. Such structures are particularly useful in complementary MOS transistor structures. In U.S. Pat. No. 3,450,961 the method disclosed employs the differential effect of different types of insulating layers over a single diffused P type region.

U.S. Pat. No. 3,461,361 granted Aug. 12, 1969 to P. Delivorias is directed to complementary MOS transistor integrated circuits with inversion layer formed by ionic discharge bombardment. U.S. Pat. No. 3,461,361 discloses a method of making a complementary pair of MOS transistors in a single semiconductor substrate body of one conductivity type silicon by first, forming a region of opposite conductivity type in the body, fabricating transistors having opposite type source and drain regions in the regions of different conductivity types, each of these transistors having silicon dioxide gate electrode insulator layers, and, after formation of the silicon dioxide layers, cooling the unit to room temperature in pure dry oxygen. Further, an inversion layer is formed in the MOS transistor by bombarding the gate insulating layer with an ionic discharge, creating acceptor sites in the insulator.

U.S. Pat. No. 3,728,695 granted Apr. 17, 1973 to Dov Frohman-Bentchkowsky is directed to a random-access floating gate MOS memory array. In U.S. Pat. No. 3,728,695 a semiconductor memory array which utilizes floating gate MOS devices as storage elements in the array is disclosed. Each storage element comprises a substrate of a first conductivity type and two spaced apart regions of opposite conductivity types. A floating gate is disposed between said two spaced-apart regions and completely insulated from said substrate by silicon oxide. A second and third gate are disposed above said floating gate and insulated from said floating gate by a layer of silicon-oxide. The space-apart regions of the device, namely the source and drain and the second and third gates are coupled to X and Y lines and to a common ground line or other common lines in the array. By application of appropriate voltages to the lines of the array charge may be selectively placed on and removed from the floating gates of the storage elements in the array, thereby programming the array with "ones" and "zeros". By application of suitable voltages to the array the information stored in the array may be read from the array.

U.S. Pat. No. 3,744,036 granted July 3, 1973 to Dov Frohman-Bentchkowsky is directed to Electrically Programmable read only memory array which employs floating gate metal-oxide-semiconductor (MOS) device as the storage element. The floating gate of the storage element is negatively charged by avalanche injection. A field effect transistor is coupled in series with the storage element to form a single memory cell. A plurality of cells comprise the array. The gate of the field effect transistor is coupled to an X-line of the memory array and one of the other terminals of this transistor, is coupled to a Y-line of the array. The array is electrically programmed by application of information to the X and Y lines of the array.

Memory elements having a floating avalanche-injection metal-oxide-silicon structure have been described by Dov Frohman-Betchkowsky in Electronics, May 10, 1971 at pages 91 through 95.

U.S. Pat. No. 3,774,087 granted to M. Pepper on Nov. 20, 1973 is directed to floating avalanche-injection metal-oxide-silicon memory elements. In U.S. Pat. No. 3,774,087, the structure of the floating avalanche-injection metal-oxide-silicon memory element is modified by having at least one diffused region in the silicon substrate which is isolated from the elements' gate and drain electrodes, which is of opposite conductivity type to the substrate, and which is situated adjacent to the channel region between the gate and drain electrodes. At least one region of the substrate situated adjacent to the channel region is also isolated from the gate and drain electrodes, the buried gate of the floating avalanche-injection metal-oxide-silicon structure partially overlaps these isolated regions and a second gate is provided on the surface of the dielectric layer of the floating avalanche-injection metal-oxide-silicon structure such that it is above and completely overlaps the silicon gate.

U.S. Pat. No. 3,794,862 granted Feb. 26, 1974 to F. B. Jenne is directed to a substrate bias circuit. U.S. Pat. No. 3,794,862 discloses a semiconductor substrate including a field effect charge pump for injecting charge into the substrate and a field effect transistor circuit, connected between the substrate and reference voltage source, responsive to the level of substrate charge for clamping the substrate bias voltage at a desired level. By controlling the gate voltage applied to the field effect transistor circuit and the number and arrangement of transistors in the circuit, the substrate bias voltage can be clamped at a value greater than, equal to, or less than the transistor threshold voltage.

Reference is made to the article entitled "Negative Resistance in FET's: An Aid or An Ailment" by Carl David Todd published in ELECTRONICS, Volume 38, No. 15, July 26, 1965, pages 57 through 61. The Todd publication discusses the phenomenon that variations in internal temperature can produce negative resistance in a silicon field effect transistor (FET) with high pinchoff voltage. The magnitude of negative resistance depends largely on three factors: amount of drain current, how much it changes with temperature, and thermal resistance between internal drain and ambient. For the FET to exhibit a voltage stable negative resistance, its drain current must have a negative temperature coefficient, and that coefficient must be large enough so that drain-current changes with temperature are significant; also, the thermal resistance between drain junction and ambient must be high. For a particular pinchoff voltage, the temperature coefficient of the FET's drain current is the result of two opposing effects, and may be either positive or negative. One effect occurs when the drain voltage is constant; the drain current tends to decrease as temperature increases because the resistivity of the silicon material in the channel has a positive temperature coefficient. The opposing effect is an increase in drain current, caused by variation in the width of the thermally generated depletion layer in the p-n junction between the gate and channel. This variation is caused by a change in pinchoff voltage, which is a result of thermal changes in the gate-to-channel contact potential. The variations in gate-channel junction width tend to increase the drain current as temperature increases.

Semiconductor memory arrays have and are receiving considerable attention in the art. Semiconductor memories have numerous advantages over prior art storage devices, such as magnetic cores, in that they require less power to operate and additionally, a greater amount of information may be stored for a given structural volume of physical memory. Among the prior art semiconductor arrays are included those where information is stored on a capacitor, typically parasitic capacitance, and wherein the information must be refreshed periodically. Also among the prior art semiconductor arrays are the type employing a MOS device having a floating gate as a memory element and the type employing a floating avalanche-injection MOS device. Other prior art memory devices use flip-flops or circuits equivalent thereto for storing information.

In accordance with the invention a multiplication mode bistable MOSFET device is provided wherein the bistable characteristics of the device are substantially, if not solely attributable to the multiplication effect of a relatively high substrate doping, or concentration. The channel length and gate oxide thickness are respectively of secondary or little concern in providing the bistable characteristic. The term multiplication effect is a recognized phenomenon in the art. Multiplication effect as applied to PN junction diodes may be briefly defined as follows:

The theory of Avalanche Multiplication is set forth in the text "Physical Electronics and Circuit Model of Transistors" (Semiconductor Electronics Committee, Volume 2) by Paul E. Gray et al, copyright 1964 by John Wiley Inc. The following excerpt is taken from pages 65 and 66 of the Gray et al text.

"4.4.1 Theory of Avalanche Multiplication

Avalanche multiplication occurs when the electric field in the space-charge layer is large enough so that carriers traversing the region acquire sufficient energy to break covalent bonds in their collisions with the crystal structure. Every such ionizing collision produces a hole and an electron, each of which is accelerated by the field and has a possibility of producing another ionizing collision before it leaves the space-charge region. Neglecting recombination in the layer, all the carriers produced will contribute to the total reverse current.

The total current is then a multiplication within the space-charge region of a primary current of carriers traversing some or all of the region. In germanium diodes, as in the idealized diode model of Chapter 3, the primary current originates outside the space-charge region. For many silicon diodes most of the primary current is produced by generation inside the region. If the primary current is $I_s$, the total reverse current is $I_s M$, where M is a multiplying factor which depends on the rate at which carriers have ionizing collisions. If $I = I_s M$ is to remain finite, M must be finite, and thus the average rate at which the hole and electron pair produced by an ionizing collision produces another pair must be less than unity in the sense discussed below.

We illustrate the mechanism of avalanche multiplication by considering a diode where most of the saturation current consists of hols collected from the n-type region ($N_D \ll N_A$). On the average, each hole from the n-type region produces $P_{1h}$ pairs of holes and electrons in traversing the space-charge region. Each secondary hole-electron pair produces, on the average, $P_2$ additional pairs, each of which in turn produces, on the average, $P_2$ additional pairs, and so forth. consequently, the total current is:

$$I = I_h [1 + P_{1h} (1+P_2+P_2^2+P_2^3 \ldots )] \qquad (4.4)$$

The series $P_{1h} (1+P_2+P_2^2+P_2^3+ \ldots )$ converges (because $P_2 < 1$) so that $$M = \frac{I}{I_R} = \frac{1 + P_{1h} - P_2}{1 - P_2} (N_A \gg N_D) \quad (4.5a)$$

A similar multiplication factor given by $$M = \frac{1 + P_{1e} - P_2}{1 - P_2} (N_D \gg N_A) \quad (4.5b)$$

can be calculated for diodes where $N_D \gg N_A$ and the primary carriers supplied by the saturation current are electrons collected from the p-type region. In both cases, M approaches infinity when $P_2$ approaches unity.

We define the avalanche breakdown voltage of a junction as $-V_a$, the voltage at which M is infinite."

Reference is also made to the text "Physics of Semiconductor Devices", by S. M. Sze, copyright 1969, John Wiley and Sons, Inc. In the Sze text, reference is specifically made to the theoretical discussion and figure set forth on pages 120, 121, 562 and 563.

Very succinctly stated the term effect as employed herein may be defined as "an increase in current flow through a semiconductor due to increased carrier activity." This succinct definition is in accord with the definition of "multiplication [electr]" set forth on page 976 of the text "McGraw-Hill Dictionary of Scientific and Technical Terms", copyright 1974.

For any MOSFET, with reference to the nomenclature in the above referenced Gray et al description of multiplication effect, the p-n junction region in which multiplication occurs is the depletion region surrounding the drain, the primary current is essentially the channel current, and whatever pair production occurs will provide a current (holes for an n-channel MOSFET, electrons for the p-channel case) which will be collected by the substrate. For state of the art MOSFETS, in which substrate doping is moderate or low, (i.e. of the order of $10^{16}$ atoms/cc or less), the value of M is so low that negligible substrate current results. For the multiplication mode bistable MOSFET, in accordance with the invention, the value of M is made large by high substrate doping, resulting in substrate current that can be comparable in magnitude to channel current, and it is this enhanced substrate current that provides the pronounced negative resistance characteristic which is featured in this invention. It should also be noted that the bistable device operation is obtained at drain voltages well below avalanche breakdown voltage; i.e. M, although large, remains finite, and the device operates in multiplication mode, not in avalanche mode.

In accordance with the invention a novel field effect transistor type structure which exhibits two-terminal negative resistance characteristics, similar to those of a tunnel diode, is provided. Unlike the tunnel diode, the negative resistance characterisitic of the device in accordance with the invention may readily be shaped by external bias control, providing a wide range of oscillatory or bistable properties. The negative resistance characteristic is obtained by the novel means of device operation which exploits the electron-hole pair multiplication effect and which is enhanced by unusually high substrate doping and by appropriate biasing.

The device in accordance with the invention exhibits a bias voltage controlled small signal negative resistance region; the device has as a unique feature a negative slope over an adjustable portion of its V-I characteristic.

Bistable action is obtained with a single device constructed in accordance with the invention.

The device in accordance with the invention is readily fabricated in large scale integrated circuit form by state of the art methods and techniques, of FET technology.

The bistable device in accordance with the invention has an "off-state" power dissipation of zero, and an "on state" power dissipation which is adjustable to less than one micro watt.

It is a primary object of the invention to provide an improved single device non-refresh memory cell.

It is a primary object of the invention to provide an improved bistable device consisting essentially of a modified MOSFET.

It is a primary object of the invention to provide an improved semiconductor memory array wherein each memory cell consists essentially of a single modified MOSFET.

It is a further object of the invention to provide an improved semiconductor device which may be utilized as an astable device, a monostable device, a bistable device, a memory cell in solid state memory, a level detector (trigger) or as a negative resistance device in small signal (linear) and large signal (non-linear) oscillatory circuits.

It is a further and additional object of the invention to provide a novel semiconductor device utilizing the known phenomenon of carrier multiplication in a suitably doped solid state structure.

It is a further and additional object of the invention to provide a novel semiconductor device of the type disclosed herein which is relatively simple and inexpensive to fabricate by existing FET technology.

The foregoing and other objects of the invention will be more apparent from the following more particular description of the preferred embodiments of the invention, as illustrated in the accompanying drawings.

In the drawings:

FIG. 1 discloses a cross-sectional view of a device in accordance with the invention.

FIGS. 2 and 3 respectively disclose in cross-sectional view a device in accordance with a preferred embodiment of the invention. In FIG. 2, the device is depicted as being in its "off" state.

In FIG. 3, the device is depicted as being in its "on" state. It will be apparent to persons skilled in the art from the detailed description of the invention hereinafter, that the preferred embodiment of the invention depicted in FIGS. 2 and 3, is not to be limited to the use of manual switches $S_1$ and $S_2$ and discrete resistor $R_L$ as depicted in the drawing for convenience of explanation.

FIG. 4A is to be viewed in conjunction with FIG. 4B which depicts the non-linear characteristic of a device in accordance with the invention.

Figure 5A:
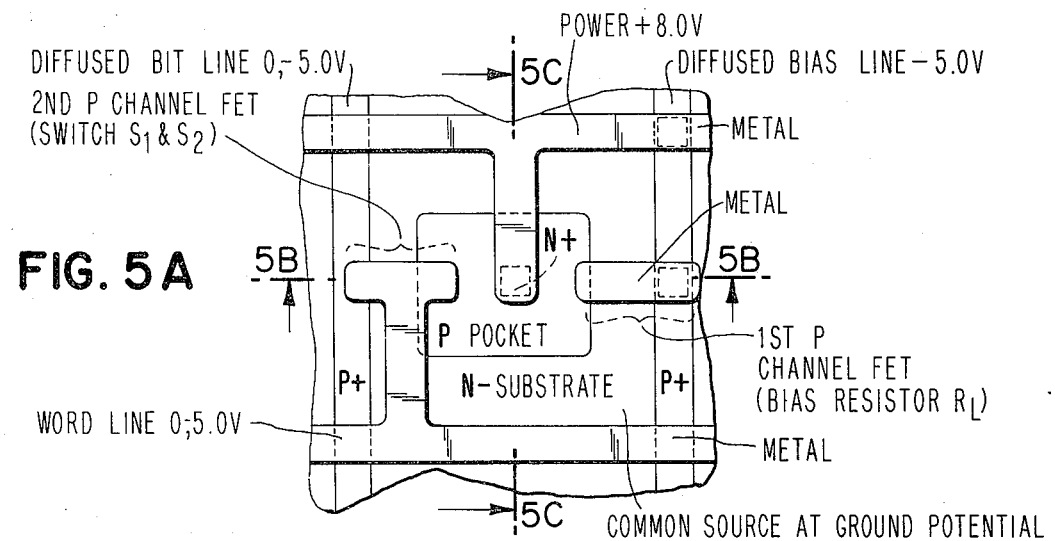
Figure 5B:
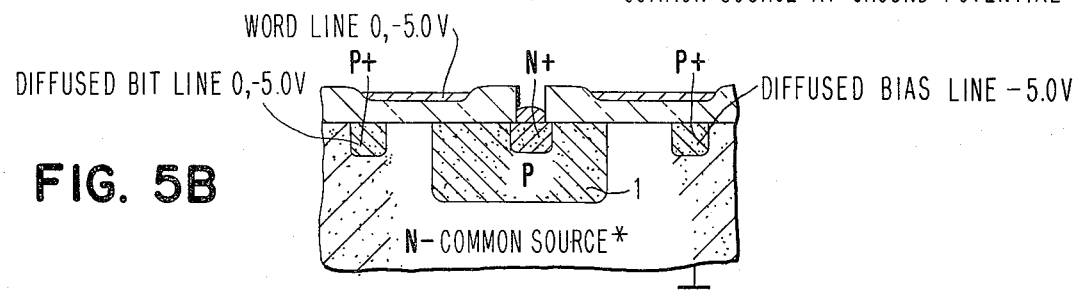
Figure 5C:
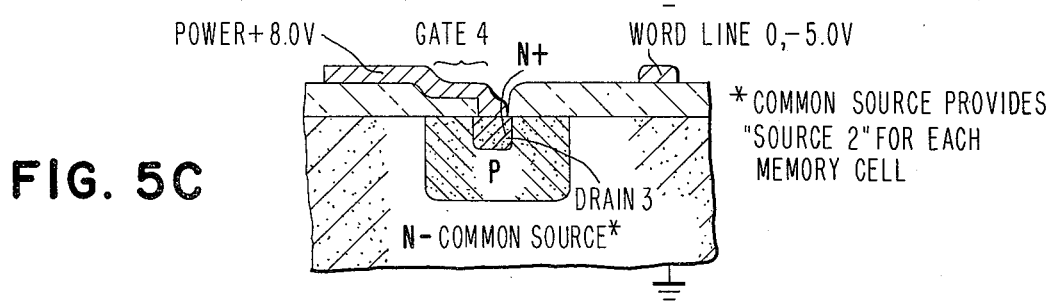

FIGS. 5A, 5B and 5C disclose a portion of a solid state array of memory cells employing a single device, in accordance with the invention, for each of the memory cells.

FIG. 5A is a planar (top) view of a portion of the solid state array of memory cells.

FIG. 5B is a first sectional view along the line 5B—5B of the structure depicted in FIG. 5A.

FIG. 5C is a second sectional view along the line 5C—5C of the structure depicted in FIG. 5A.

Figure 6:
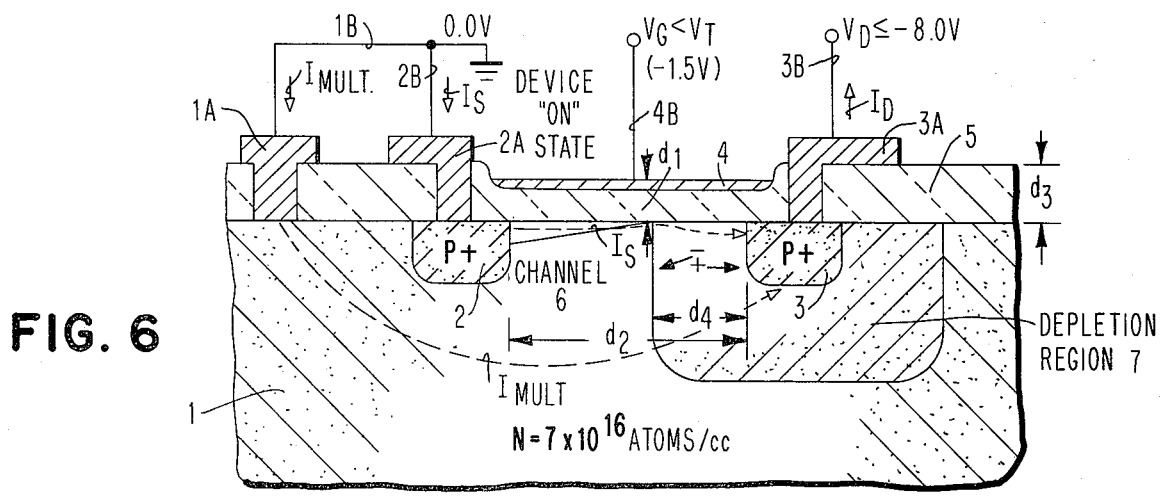

FIG. 6 discloses a cross-sectional view of a device in accordance with the invention.

PREFERRED EMBODIMENT

Figure 1:
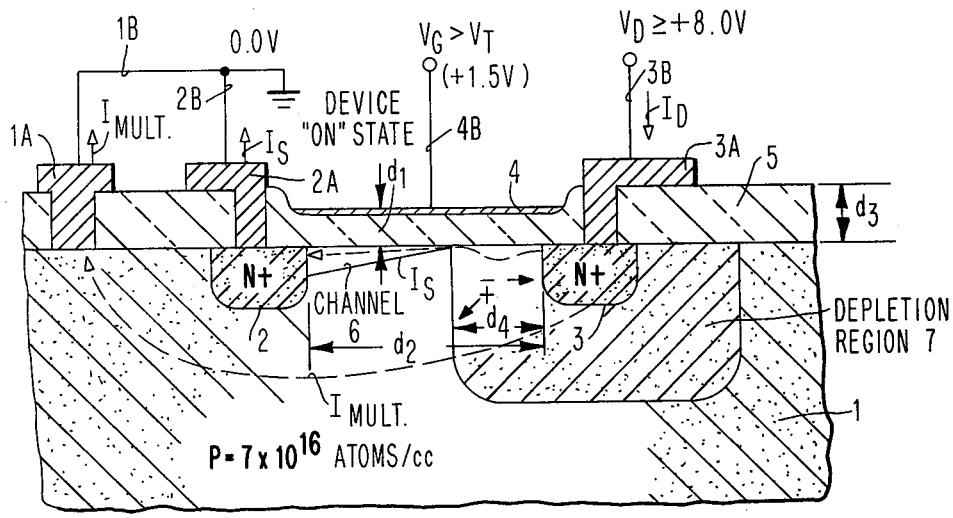

Reference is made to FIG. 1 which depicts in cross-sectional view a preferred embodiment of a solid state device in accordance with the invention. The structure shown is readily recognizable as an enhancement mode N channel MOSFET type structure with the substrate highly doped. The substrate 1 is P type silicon material whose doping concentration is equal to, or greater than, $5 \times 10^{16}$ atoms per cubic centimeter. A preferred doping concentration of P-type atoms, such as boron, in the substrate 1 is approximately $7 \times 10^{16}$ atoms per cubic centimer.

It should be noted that, because of their relatively low substrate doping, conventional FET devices, even if biased in the novel manner described for this preferred embodiment, will not exhibit similar enhanced multiplication caused negative resistance and bistable state properties. Before the drain voltage of a conventional FET can be raised to a high enough value to cause significant carrier multiplication in the drain depletion region beyond the channel tip, avalanche breakdown occurs between drain and substrate. This premature breakdown is caused by electric field enhancement at the edge of the drain nearest the gate due to the gate-drain field in the gate dielectric, (see for example, page 563, FIGS. 37 and 38 of the afore-identified Sze text) as well as by the field enhancement near the drain due to drain diffusion curvature. (See for example, page 121, FIG. 29 of the afore-identified Sze text). The high substrate doping level of the preferred embodiment avoids this premature breakdown by making the field in the drain depletion region primarily a function of the substrate doping; i.e. relatively independent of the distorting effects of gate-drain proximity and of drain diffusion curvature.

Now referring again to FIG. 1, N$^+$ region 2 in substrate 1 functions as the source of the device. The source 2 preferably has a doping of arsenic atoms in a concentration of $10^{20}$ atoms/cc. N$^+$ region 3 in substrate 1 functions as the drain of the device. The drain 3 preferably has a doping of arsenic atoms in a concentration of $10^{20}$ atoms/cc. The silicon dioxide layer 5 overlies the upper planar surface of substrate 1 as viewed in FIG. 1. The SiO$_2$ layer 5 has windows through which electrical contact is made with the substrate 1, the source 2 and the drain 3. The substrate 1 is connected via metallic contact 1A, and lead 1B to a reference potential (ground). Source region 2 is connected via metallic contact 2A, lead 2B and lead 1B to the reference potential (ground). Drain region 3 is connected via metallic contact 3A and lead 3B to a supply of drain potential (V$_D$).

In FIG. 1, layer 5 is a layer of insulating material, and is composed of two regions of significantly different thickness. These regions are the gate region and the field region. In the preferred embodiment, both regions comprising layer 5 employ SiO$_2$ as the dielectric material, although other insulating materials (examples: Si$_3$N$_4$, or silicon oxy-nitride compounds) could be used.

The gate region in FIG. 1 is the layer of SiO$_2$ overlying the conventional channel region and underlying the gate electrode 4. The gate electrode 4 is spaced a distance $d_1$ from the surface of the conventional channel region, where the term "conventional channel region" is defined as the region extending from the source region to the drain region and has a length designated by dimension $d_2$ in FIG. 1. In the preferred embodiment, the dimension $d_1$ is approximately 500A. The field region in FIG. 1 comprises that part of layer 5 not defined as gate region. The thickness of the field region is designated by dimension $d_3$. In the preferred embodiment, the dimension $d_3$ is 6000A and the dielectric is SiO$_2$.

The metallic gate electrode 4 is substantially coextensive in length with the conventional channel region. Namely, the gate electrode has a length approximately equal to the dimension $d_2$, where $d_2$ (also termed L$_{effective}$) is preferably $50 \times 10^{-6}$ inches, or 50 microinches.

The gate electrode 4 is connected via a lead 4B to a source of gate potential (V$_G$).

The operation of the preferred embodiment of the invention will be undertaken with reference to the device of FIG. 1 and the following bias potentials applied to said device. The substrate 1 and source region 2 are connected in common to ground. The drain region 3 is connected to a positive potential (V$_D$) having a magnitude of approximately 8.0 Volts. The gate electrode 4 is connected to a positive potential (V$_G$) having a magnitude of approximately 1.5 Volts. It is to be noted that with a gate voltage of V$_G$ = +1.5 Volts, the threshold voltage V$_T$ of the device is exceeded. Under the foregoing conditions the device of FIG. 1 is turned "on." The device of FIG. 1 when turned "on" may be considered to be very similar to a weakly turned "on" conventional enhancement mode N channel MOSFET in pinch-off. The bistable nature of this FET type structure is essentially derived from, or substantially predicated on the multiplication effect of a high drain depletion region field due to the relatively high substrate concentration. The length of the conventional channel region, or the gate oxide thickness, is of secondary importance. The high substrate concentration combined with a sufficient (relatively high) drain voltage creates an electric field in the resultant drain depletion region 7 which is strong enough, between the tip of the channel 6 and the drain 3, for carrier multiplication to occur. It will be noted that in the turned "on" state, the device of FIG. 1 has a channel 6 which extends from the source region 2, with decreasing cross-sectional area, toward the drain region 3. From FIG. 1, it will be seen that channel 6 extends from the source region 2 to the drain depletion region 7 which within substrate 1 substantially encompasses the drain region 3. As depicted in FIG. 1, the drain depletion region 7 has a lateral dimension of $d_4$, the channel 6 has a length of essentially $(d_2-d_4) = 35$ microinches. The multiplication effect has been demonstrated to occur with a gate oxide having a thickness in the range of 500 to 1800 angstroms, where the channel length $(d_2-d_4)$ is in the range of 35 to 450 microinches, and the channel width is equal to approximately 0.0015 inches. That is, where T$_{ox}$ is the thickness of the gate oxide, and, where L$_{eff}$ is the effective channel length, T$_{ox}$ = 500 to 1800A, and L$_{eff}$ = 50 to 465 microinches.

Multiplication is obtained by imparting sufficient kinetic energy to a significant number of channel electrons as they come under the influence of the high drain depletion region field. Upon collision within the silicon lattice, these electrons generate electron hole pairs. The generated electrons are collected by the drain 3, as additional drain current ($I_D$) and the holes are collected by the relatively negative substrate as substrate current, which is defined as multiplication current ($I_{mult.}$). It is to be noted and appreciated that $I_{mult.}$ may typically equal or exceed the source current ($I_S$). In the circuitry and solid state structure depicted in FIG. 1, the drain current ($I_D$) has a magnitude in the order of 10μA (ten microamperes), the source current ($I_S$) has a magnitude in the order of 5μA, and the multiplication current flowing in the substrate 1 has a magnitude in the order of 5μA. Thus it is apparent that the following relationship between the drain current, the source current and the multiplication current exists:

$$I_D = I_S + I_{mult.}$$

Figure 2:
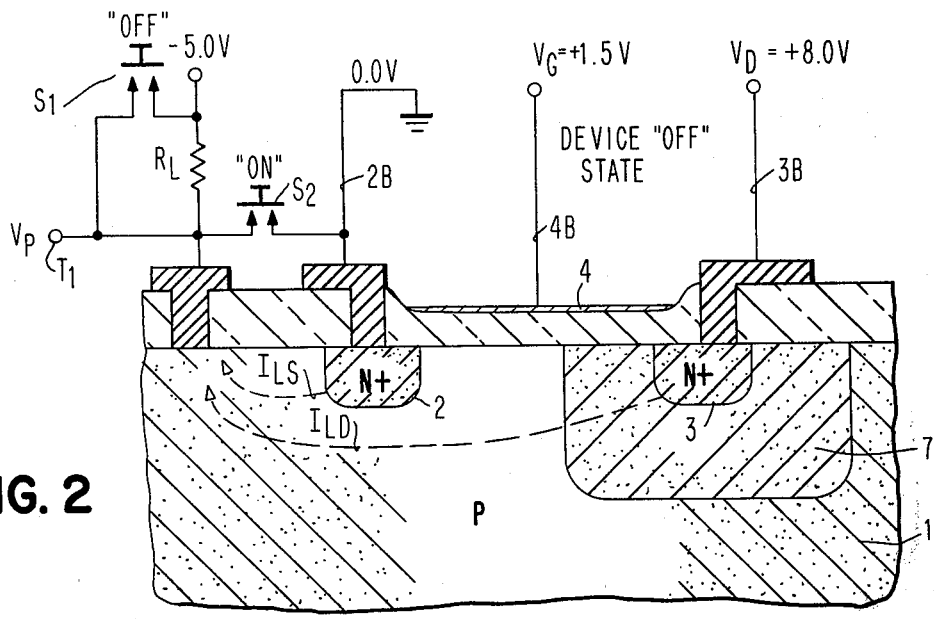

To examine how this multiplication effect is exploited to achieve a bistable device reference is made to FIG. 2 which illustrates the device in the "off" state. It is to be noted that the substrate 1 is now returned, via a bias resistor ($R_L$) to a −5.0 Volt substrate bias. This bias voltage is employed to effectively raise the threshold voltage ($V_T$) of the device above the 1.5 volt gate voltage to turn the device "off".

As an aid in explaining how the device is turned "on" and turned "off", two normally open switches $S_1$ and $S_2$, of which only one can be closed at any time, have been connected as shown in FIG. 2. Switch $S_1$ is connected across the substrate bias resistor $R_L$. With $S_2$ open, when $S_1$ is closed the bias resistor $R_L$ is shunted and −5.0 Volts is impressed on the substrate 1. With $S_1$ open, when switch $S_2$ is closed the substrate 1 is connected in common with source 2 to reference potential (ground).

When switch $S_1$ is momentarily closed, the substrate potential is decreased to −5.0 Volts, the threshold voltage ($V_T$) of the device in FIG. 2 is thereby raised above the gate voltage ($V_G$) of the device, and the device is turned "off". With the device in the "off" state "conventional channel current" is essentially zero in magnitude. However, with the device in the "off" state there are two extremely low leakage currents across the source 2/substrate 1 junction and the drain 3/substrate 1 junction. These leakage currents depicted in FIG. 2 are respectively labelled $I_{LD}$ (Drain Junction Leakage Current) and $I_{LS}$ (Source Junction Leakage Current). The sum of these leakage currents flow through the substrate bias resistor $R_L$ and tend to reduce the substrate bias. This reduction in substrate bias will tend to turn the device "on" unless this tendency is minimized by a low enough resistance value of $R_L$. A suitable resistance value of $R_L$ is in the range of 1 to 10 megohms. (Preferably $R_L$ equals 1 megohm).

Still referring to FIG. 2, which depicts the device in the "off" state, the sum of the leakage currents $I_{LD} + I_{LS}$ is less than $10^{-9}$ amperes.

Thus, where $I_{LD} + I_{LS} << 10^{-9}$ Amperes, and $R_L$ is in the range of 1 megohm to 10 megohm.

$(I_{LD} + I_{LS}) \times (R_L) \approx 0$ Volts.

Thus, where $$V_p = -5.0 + (I_{LD} + I_{LS}) R_L$$

$$V_p \approx -5.0 \text{ Volts.}$$

Figure 3:
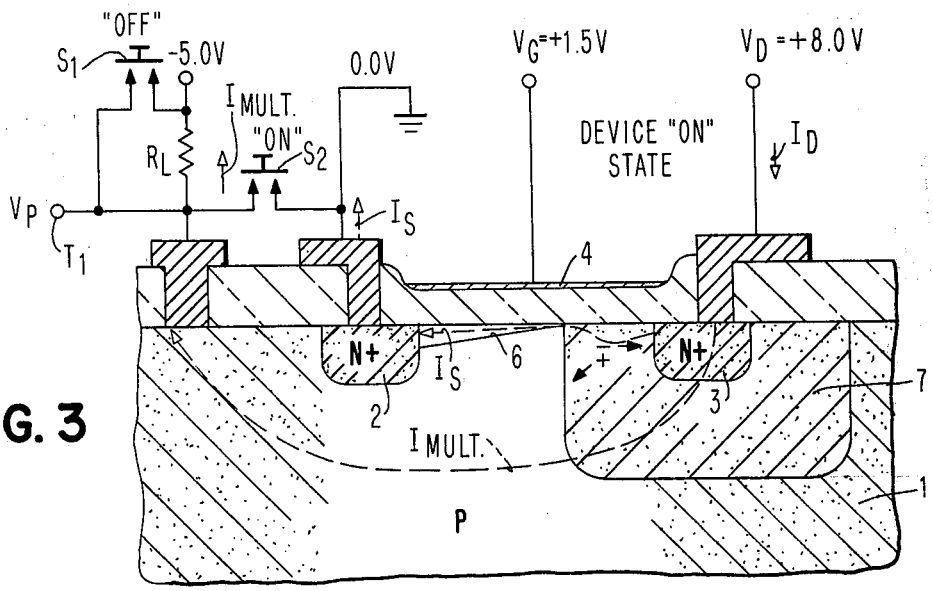

Reference is made to FIG. 3. The device in the "on" state, as depicted in FIG. 3, is merely the device in the "off" state, as depicted in FIG. 2, subsequent to the momentary closure of the "on" switch $S_2$. The momentary closure of the "on" switch momentarily connects the substrate, in common with the source, to ground potential. The momentary reduction in the substrate bias to zero volts allows the device to turn "on". When the device is turned "on", a significant number of channel electrons, upon entering the drain depletion region, generate electron-hole pairs resulting in a relatively high substrate multiplication current ($I_{mult.}$). In fact, subsequent to the momentary closing of the "on" switch $S_1$, the multiplication current ($I_{mult.}$) is high enough to drive the effective substrate bias slightly positive as it flows through substrate bias resistor $R_L$. Namely, ($I_{mult.}$) ($R_L$) is greater in magnitude than 5 volts. As is apparent from the earlier description and explanation of the "off" state, to return the device to the "off" state, the "off" switch $S_1$ is momentarily closed. The momentary closure of the "off" switch $S_1$ overrides the effect of $I_{mult.}$ and returns the effective substrate bias to minus 5.0 Volts. With the substrate bias at −5.0 Volts, the current flow in channel 6 is eliminated.

From the foregoing description and explanation of the operation of the device in the "on" state and in the "off" state, it will now be apparent that the potential $V_P$ manifested at terminal $T_1$ (FIGS. 2 and 3) closely approaches −5.0 Volts when the device is in its "off" state, and closely approaches 0.5 Volts when the device is in its "on" state.

$V_P$-$I_P$ CHARACTERISTICS OF THE DEVICE OF FIGS. 1, 2 AND 3

Figure 4A:
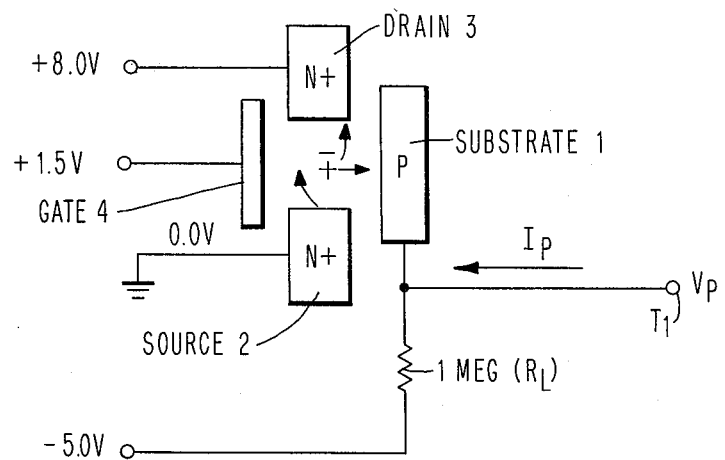
FIG. 4A depicts in a very simplified form, a very schematic embodiment of the invention.
Figure 4B:
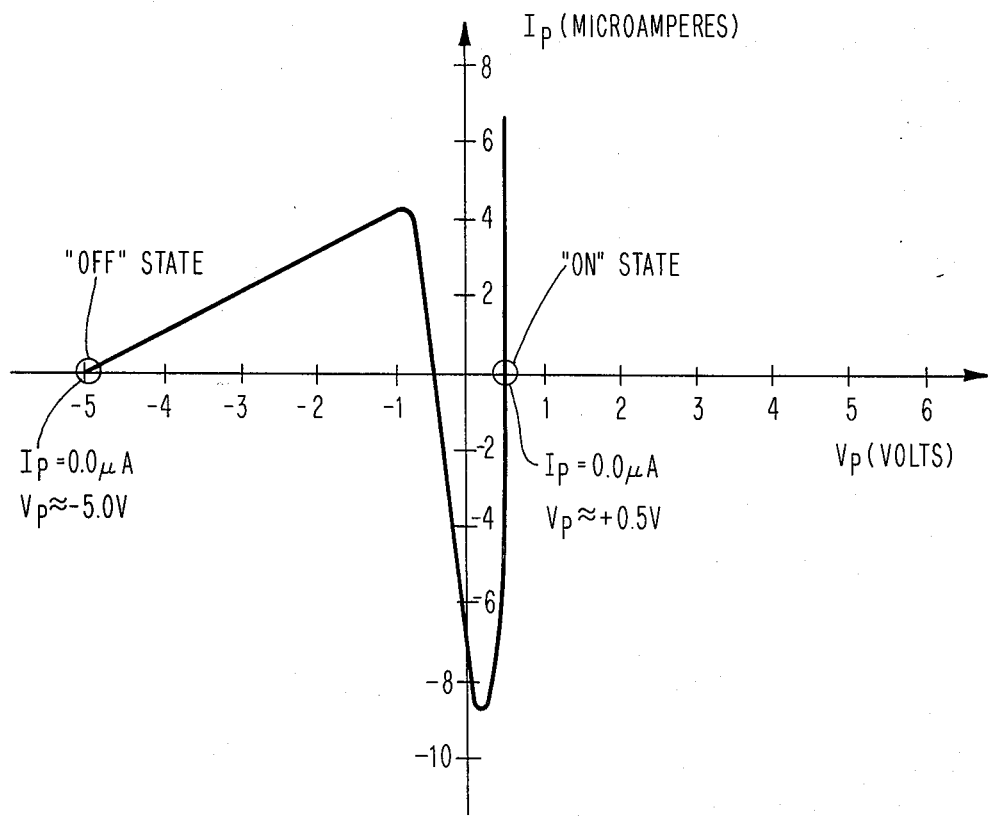
FIG. 4B is a plot of $I_p$ versus $V_p$ expressly showing first and second stable electrical states of a device in accordance with the invention.

Reference is made to FIGS. 4A and 4B. In FIG. 4A the structure of the device, including potentials applied thereto, together with appropriate explanatory legends is schematically depicted. FIG. 4B sets forth a graph of $V_p$ versus $I_p$ and expressly discloses the negative resistance region of the device as well as the two stable states ("on" and "off") of the device. When $V_p$ (substrate bias) is minus 5 volts, the device is "off", the voltage across the 1 megohm substrate bias resistor ($R_L$) is approximately 0 volts and the input current ($I_p$) to the device is also zero. As $V_p$ is raised in a positive direction, $_p$ increases linearly through $R_L$ until the device turns "on" and substrate current ($I_{mult.}$) is generated. As $I_{mult.}$ overrides the current drawn by $R_L$, the device becomes a source of current rather than a sink. This current reversal results in a negative resistance characteristic. When $V_p$ is raised above zero volts, the device again becomes a sink of current as the substrate/source, P/N junction is forward biased. It is to be noted that there are two points on the Volt/Ampere characteristic of the device as represented in FIG. 4B where the device draws no current ($I_p = 0$). These points are the two stable voltage states (approximately $V_p = -5.0V$ and $V_p = +0.5V$). These are the stable states hereinbefore termed the "off" state and the "on" state.

MEMORY CELL APPLICATION

The device in accordance with the invention and as described and explained hereinabove has particular utility as a memory cell in an integrated circuit memory array.

Referring to FIG. 5A, a planar view of a single memory cell of a memory array structure employing a plurality of devices in accordance with the invention is depicted. FIG. 5B is a sectional view of the structure of FIG. 5A taken along the lines 5B—5B. FIG. 5C is a sectional view of the structure of FIG. 5A taken along the lines 5C—5C. It will be noted that a P type pocket serves as the P type substrate of the memory cell. That is, the P type substrate 1 (FIGS. 1, 2 and 3) is now a P type pocket in an N-substrate to facilitate fabrication in integrated circuit form by large scale integration techniques known in the art. Also, the N type substrate serves as a common source for each of the bistable devices or memory cells of the array. The fixed +1.5 volt gate voltage supply has been eliminated by increasing the gate oxide thickness and connecting the gate (4) directly to the +8 volt drain supply voltage. A first P channel FET (see FIG. 5A) serves as the pocket bias resistor ($R_L$). A second P channel FET (see FIG. 5A) serves as a momentary closure switch to force the pocket voltage of the bistable device of the memory cell to the "on" or "off" state. The second P channel FET is turned off and on by 0.0 and −5.0 Volts respectively on the word line, and the "on" or "off" state that it forces on the P pocket of the bistable device of the memory cell is determined by conditioning the bit line to zero or minus 5 volts respectively.

FIG. 5A shows a single memory cell, assumed to be part of a multi-bit word in a multi-word memory array. For this explanation, the "one" and "zero" information states are arbitrarily defined as bistable cell "on" and "off" states respectively. Initial conditions, before selecting any word location for writing or reading information bits, are: all power conductors are maintained at +8.0 Volts, all bias line conductors are maintained at −5.0 Volts, all word lines are temporarily at 0.0 Volts, and bit line potentials are immaterial since the 0.0 Volt word lines essentially disconnect all bistable devices from all bit lines. For either writing or reading, each bit line in the array corresponds to a particular bit location on the binary sequence making up a word. To write a particular multi-bit word into the array, each bit line is preconditioned by circuits peripheral to the array with 0.0 Volts for a "one" or with −5.0 Volts for a "zero". For the memory word location desired, the potential of the appropriate word line is momentarily switched to −5.0 Volts, thus turning on all the 2nd P-channel FETs for that word. The bistable cells are thus set in on and off states corresponding to the one and zero information bits which preconditioned the bit line potentials. When the word line is returned to 0.0 Volts at the end of its momentary excursion to −5.0 Volts, the bistable cells maintain the states that were determined by the bits of the word to be stored.

To read out information previously stored in some word location, the bit lines are connected (by array peripheral circuitry) to receptors which are voltage or current sensitive. The word line for the desired location is selected and is momentarily switched to −5.0 Volts, thus turning on (as in the write operation) the 2nd P-channel FETs in that word. The on or off state of each bistable cell in the desired word uniquely determines the signal imparted to its bit line. Since the peripheral circuits now duplicate the bit sequence information that was stored in the desired word location, the word line is returned to its original 0.0 Volt condition.

SUMMARY

Set forth below in very summary form are the more salient features, requirements and conditions for the practice of the invention.

Reference is made to FIG. 1. Desirable for enhancing the multiplicaton effect are:

1. High concentration of substrate doping (equal to, or greater than $5 \times 10^{16}$ atoms/cubic centimeter, preferably $7 \times 10^{16}$ atoms/cubic centimeter.)
2. Sufficiently high drain voltage, acting in combination with item (1), such that a high lateral electric field will exist in the drain depletion region beyond the channel tip.

Reference is made to FIG. 2. With the device in accordance with the invention in the "off" state, the following conditions exist:

1. $V_G < V_T$ (No channel is formed due to the minus 5 volt substrate bias, $V_p$).
2. $I_{LD}$, a drain junction leakage current exists and is very small in magnitude.
3. $I_{LS}$, a source juncton leakage current exists and is very small in magnitude.
4. $I_{LD} + I_{LS} << 10^{-9}$ Amperes $$(I_{LD} + I_{LS})(R_L) \approx 0 \text{ Volts, where } R_L = 1 \text{ megohm}$$

$$V_p = -5 + )I_{LD} + I_{LS}) (R_L)$$

$$V_p \approx -5.0 \text{ Volts}$$

Reference is made to FIG. 3. With the device in accordance with the invention in the "on" state the following conditions exist:

1. $V_G > V_T$ (Channel is formed due to zero volts substrate bias, $V_p$).
2. $I_{mult.}$, a multiplication current, relatively sizeable in magnitude flows in the substrate. The multiplication current is equal to, or larger in magnitude than source current. The multiplication current is very much larger in magnitude than the sum of $I_{LD}$ and $I_{LS}$ defined previously.
3. $I_{mult.} (R_L) = 5.0$ Volts, where $R_L = 1$ megohm.

$$V_p = -5.0 + I_{mult.} (R_L)$$

$-V_p = +0.5$ volts (Clamped by source/substrate junction.)

Reference is made to FIGS. 4A and 4B. The device in accordance with the invention has a well defined negative resistance region which provides two discrete stable electrical states.

Reference is made to FIGS. 5A, 5B and 5C. The device in accordance with the invention has particular utility as a memory cell in a solid state memory cell array.

From the foregoing description of applicants' invention, and the description of preferred embodiments thereof, numerous changes and modifications will be apparent to persons skilled in the art without departing from the spirit and scope of the invention.

It is to be noted that the conductivity type of the device, in accordance with the invention, has been described as N-channel. The device may also be constructed with conductivity type opposite to that disclosed herein, with corresponding changes in bias polarities, as illustrated in FIG. 6. For FIG. 6, all dimensions of FIG. 1 apply, but it should be noted that the substrate of FIG. 6 is N type, the source and drain diffusion are P type, the polarity of each bias voltage is opposite to that shown in FIG. 1, and all currents are drawn in directions opposite to those shown in FIG. 1. The N-channel device of FIG. 1 is preferable to the P-channel embodiment of FIG. 6 because of the longer mean free path of electrons (N-channel current) in the drain depletion region. For similar doping level and bias magnitude, the longer mean free path in the electron channel current case results in a more pronounced multiplication effect.

While this invention has been particularly described with reference to the preferred embodiments thereof, it will be understood by those skilled in the art that the foregoing and other changes in form and detail may be made without departing from the spirit and scope of the invention.

What is claimed is:

1. A memory cell for use in a monolithic memory having an array of memory cells, each said cell having the capability to assume a first distinct conductive state or a second distinct conductive state, each said cell consisting essentially of a single N channel field effect type transistor structure having a source region, a channel region, a gate electrode, and a drain region contained on and within a substrate of P-type semiconductor material having an impurity concentration of P-type atoms in approximately the amount of $5 \times 10^{16}$ to $7 \times 10^{16}$ atoms per cubic centimeter;

means for applying a potential of approximately +8 volts on said drain region;

means for applying a potential of approximately +1.5 volts on said gate electrode, said gate electrode being capacitively coupled to said channel region;

means for applying a potential of approximately zero volts on said source region;

a resistor connecting said substrate to a potential of approximately −5 volts;

controllable switching means connected to said substrate for momentarily impressing either a potential of zero volts or a potential of −5 volts on said substrate, whereby said cell consisting essentially of a single N channel field effect type transistor structure will assume said first distinct conductive state in response to said switching means momentarily impressing a potential of zero volts on said substrate and said cell consisting essentially of a single N channel field effect type transistor structure will assume said second distinct conductive state in response to said switching means momentarily impressing a potential of −5 volts on said substrate.

2. A memory cell for use in a monolithic memory having an array of memory cells, as recited in claim 1, wherein each said cell essentially consists of a single P-channel field effect type transistor structure, said impurity of said substrate is P-type atoms, and said potentials recited in claim 1 are opposite in polarity.

3. A memory cell for use in a monolithic memory having an array of memory cells where each of said memory cells consists essentially of a first conductivity type channel field effect transistor structure having the inherent characteristic to assume first and second discrete stable states of conductivity respectively in response to a momentary change in substrate biasing potential, said memory cell including:

a substrate of semiconductor material of a second conductivity type, said substrate having at least one substantially planar surface;

a first region of said first conductivity type contained within said substrate and extending to said planar surface of said substrate;

a second region of said first conductivity type contained within said substrate and extending to said planar surface of said substrate;

said first and second regions being spaced apart within said substrate one from the other, whereby a third region of said second conductivity extends from said first region to said second region on said planar surface of said substrate;

first means applying a first potential to said first region;

second means applying a second potential to said second region;

third means capacitively coupling at least a portion of said third region to a third potential;

switchable means for momentarily impressing either a fourth potential or a fifth potential on said substrate, said switchable means including means for biasing said substrate at a potential other than said fourth potential or said fifth potential in the absence of said switchable means momentarily impressing either said fourth potential or said fifth potential on said substrate;

whereby when said switchable means impresses said fourth potential on said substrate said memory cell assumes said first discrete state of conductivity, and when said switchable means impresses said fifth potential on said substrate said memory cell assumes said second discrete state of conductivity.

4. A memory cell as claimed in claim 3 wherein said first conductivity type is P-type and said second conductivity type is N-type.

5. A memory cell as claimed in claim 4 wherein said first conductivity type is N-type and said second conductivity type is P-type.

6. A memory cell, as claimed in claim 5, wherein said first potential and said second potential are respectively more positive in magnitude than said third potential, said fourth potential is approximately equal to said third potential in magnitude, and said fifth potential is less positive in magnitude than said third potential.

7. A memory cell, as claimed in claim 4, wherein said first potential and said second potential are respectively less positive in magnitude than said third potential, said fourth potential is approximately equal to said third potential in magnitude, and said fifth potential is less negative in magnitude than said third potential.

8. In a monolithic memory having an array of memory cells, each said cell having the capability to assume first and second stable electrical states of conductivity, each of said memory cells comprising:

a pocket of P-type semiconductor material contained within an N-type semiconductor substrate;

a pocket of N-type semiconductor material contained within said pocket of P-type semiconductor material;

first means for applying a first substantially constant potential to said substrate;

second means connecting said P-type pocket of semiconductor material via a bias resistance, to a second substantially constant potential;

third means connecting said pocket of N-type semiconductor material to a third substantially constant potential, said third means including means for capacitively coupling at least a portion of said pocket of P-type material to said third potential;

controllable fourth means for momentarily impressing on said pocket of P-type material either said first substantially constant potential or said second substantially constant potential, whereby said memory cell assumes said first stable state of conductivity in response to said controllable third means momentarily impressing said first substantially constant potential on said pocket of P-type semiconductor material, or said second stable state of conductivity in response to said controllable third means momentarily impressing said second substantially constant potential on said pocket of P-type semiconductor material.

9. In a monolithic memory having an array of memory cells, each said cell having the capability to assume first and second stable electrical states of conductivity, as recited in claim 8, wherein each of said memory cells consists essentially of an N channel field effect transistor type structure, where said pocket of N type semiconductor material functions as a drain, at least a portion of said pocket of P-type semiconductor material functions as a channel, and said N-type semiconductor substrate functions as a source.

10. In a monolithic memory having an array of memory cells, each said cell having the capability to assume first and second stable electrical states of conductivity, as recited in claim 9, wherein said second means includes a first P channel field effect transistor and where said controllable fourth means includes a second P channel field effect transistor.

11. In a monolithic memory having an array of memory cells, each said cell having the capability to assume first and second stable electrical states of conductivity, as recited in claim 10, where said first P channel field effect transistor of said second means functions as a resistor connecting said pocket of P type material to said second substantially constant potential, where said second substantially constant potential is less positive than said first substantially constant potential, where said third substantially constant potential is more positive than said first substantially constant potential and where said second P channel field effect transistor of said controllable fourth means functions as a normally open single pole double throw switch.

12. In a monolithic memory having an array of memory cells, each cell having the capability to assume first and second stable electrical states of conductivity, as recited in claim 11, where said first potential has a magnitude of approximately 0 volts, said second potential has a magnitude of approximately negative 5 volts, and where said third potential has a magnitude of approximately positive 8 volts.

13. In a monolithic memory having an array of memory cells, as recited in claim 8, where additional means is provided for selectively writing multi-bit binary words into said memory, and said additional means includes further means for selectively reading multi-bit binary words stored in said memory.

14. In a monolithic memory having an array of memory cells, each said cell having the capability to assume first and second stable electrical states of conductivity, each of said memory cells comprising a pocket of N-type semiconductor material contained within a P-type semiconductor substrate;

a pocket of P-type semiconductor material contained within said pocket of N-type semiconductor material;

first means for applying a first substantially constant potential to said substrate;

second means connecting said N-type pocket of semiconductor material via a bias resistance, to a second substantially constant potential;

third means connecting said pocket of P-type semiconductor material to a third substantially constant potential, said third means including means for capacitively coupling at least a portion of said pocket of N-type material to said third potential;

controllable fourth means for momentarily impressing on said pocket of N-type material either said first substantially constant potential or said second substantially constant potential, whereby said memory cell assumes said first stable state of conductivity in response to said controllable third means momentarily impressing said first substantially constant potential on said pocket of N-type semi-conductor material, or said second stable state of conductivity in response to said controllable third means momentarily impressing said second substantially constant potential on said pocket of N-type semiconductor material.

15. In a monolithic memory having an array of memory cells, each said cell having the capability to assume first and second stable electrical states of conductivity, as recited in claim 14, wherein each of said memory cells consists essentially of a P channel field effect transistor type structure, where said pocket of P-type semiconductor material functions as a drain, at least a portion of said pocket of N-type semiconductor material functions as a channel, and said P-type semiconductor substrate functions as a source.

16. In a monolithic memory having an array of memory cells, each said cell having the capability to assume first and second stable electrical states of conductivity, as recited in claim 15, wherein said second means includes a first N channel field effect transistor and where said controllable fourth means includes a second N channel field effect transistor.

17. In a monolithic memory having an array of memory cells, each said cell having the capability to assume first and second stable electrical states of conductivity, as recited in claim 16 where said first N channel field effect transistor of said second means functions as a resistor connecting said pocket of N type material to said second substantially constant potential, where said second substantially constant potential is more positive than said first substantially constant potential, where said third substantially constant potential is less positive than said first substantially constant potential and where said second N channel field effect transistor of said controllable fourth means functions as a normally open single pole double throw switch.

18. In a monolithic memory having an array of memory cells, each cell having the capability to assume first and second stable electrical states of conductivity, as recited in claim 17, where said first potential has a magnitude of approximately 0 volts, said second potential has a magnitude of approximately positive 5 volts, and where said third potential has a magnitude of approximately negative 8 volts.

19. In a monolithic memory having an array of memory cells, as recited in claim 14, where additional means is provided for selectively writing multi-bit binary words into said memory, and said additional means includes further means for selectively reading multi-bit binary words stored in said memory.

* * * * *